(12) United States Patent
Suzuki

(10) Patent No.: US 7,675,340 B2
(45) Date of Patent: Mar. 9, 2010

(54) MULTIPHASE CLOCK GENERATOR CIRCUIT

(75) Inventor: Kouichi Suzuki, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 0 days.

(21) Appl. No.: 11/068,917

(22) Filed: Mar. 2, 2005

(65) Prior Publication Data

US 2006/0055443 A1 Mar. 16, 2006

(30) Foreign Application Priority Data

Sep. 16, 2004 (JP) .............................. 2004-269389

(51) Int. Cl.
*H03K 3/00* (2006.01)
(52) U.S. Cl. ...................... 327/295; 327/291
(58) Field of Classification Search ................ 327/115, 327/117, 291, 295
See application file for complete search history.

(56) References Cited

U.S. PATENT DOCUMENTS 3,809,787 A * 5/1974 Mochida ...................... 84/676
3,829,783 A * 8/1974 Groenendaal et al. ........ 327/115
4,434,696 A * 3/1984 Conviser ...................... 84/675

FOREIGN PATENT DOCUMENTS

JP 2001-318731 11/2001

OTHER PUBLICATIONS

Chinese Office Action, dated Jul. 3, 2009, 13 pages.

* cited by examiner

*Primary Examiner*—Lincoln Donovan
*Assistant Examiner*—Khareem E. Almo
(74) *Attorney, Agent, or Firm*—Arent Fox LLP

(57) ABSTRACT

A multiphase clock generator circuit for generating a plurality of output clock pulses that differ in phase on the basis of a reference clock pulse, has first and second divider circuits for dividing first and second reference clock pulses that differ in phase to generate output clock pulses, and a switch for forming an intermittent short between predetermined nodes of the first and second divider circuits, wherein the switch forms a short between the predetermined nodes with timing in which the predetermined nodes are brought to the same level in a normal operating state.

3 Claims, 11 Drawing Sheets

Multiphase Clock Generator Circuit (Embodiment 4)

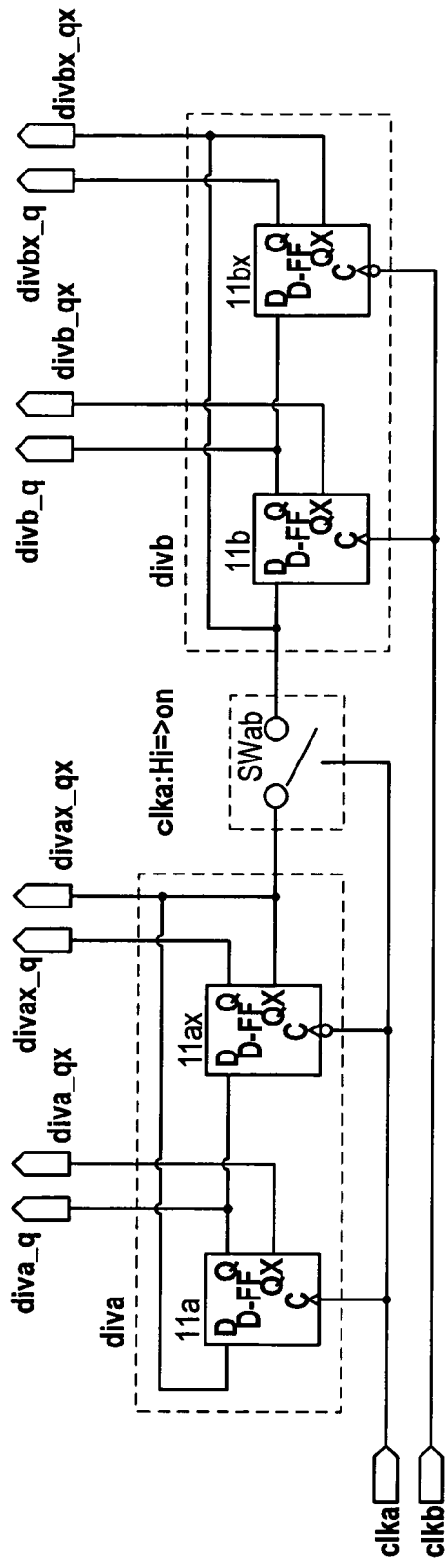
FIG. 2A Multiphase Clock Generator Circuit (Principles)
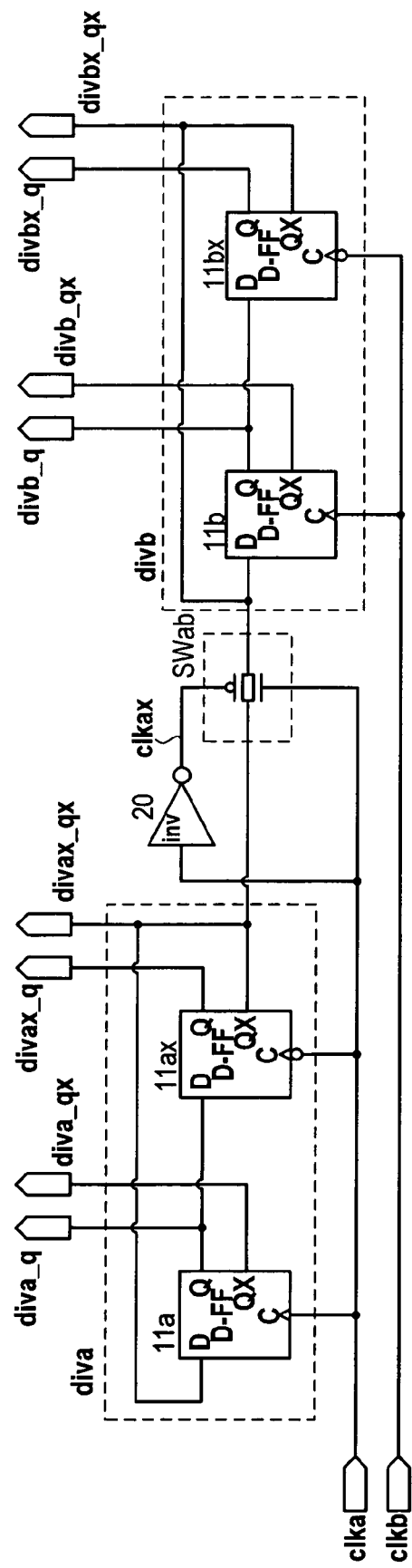
FIG. 2B Multiphase Clock Generator Circuit (Embodiment 1)

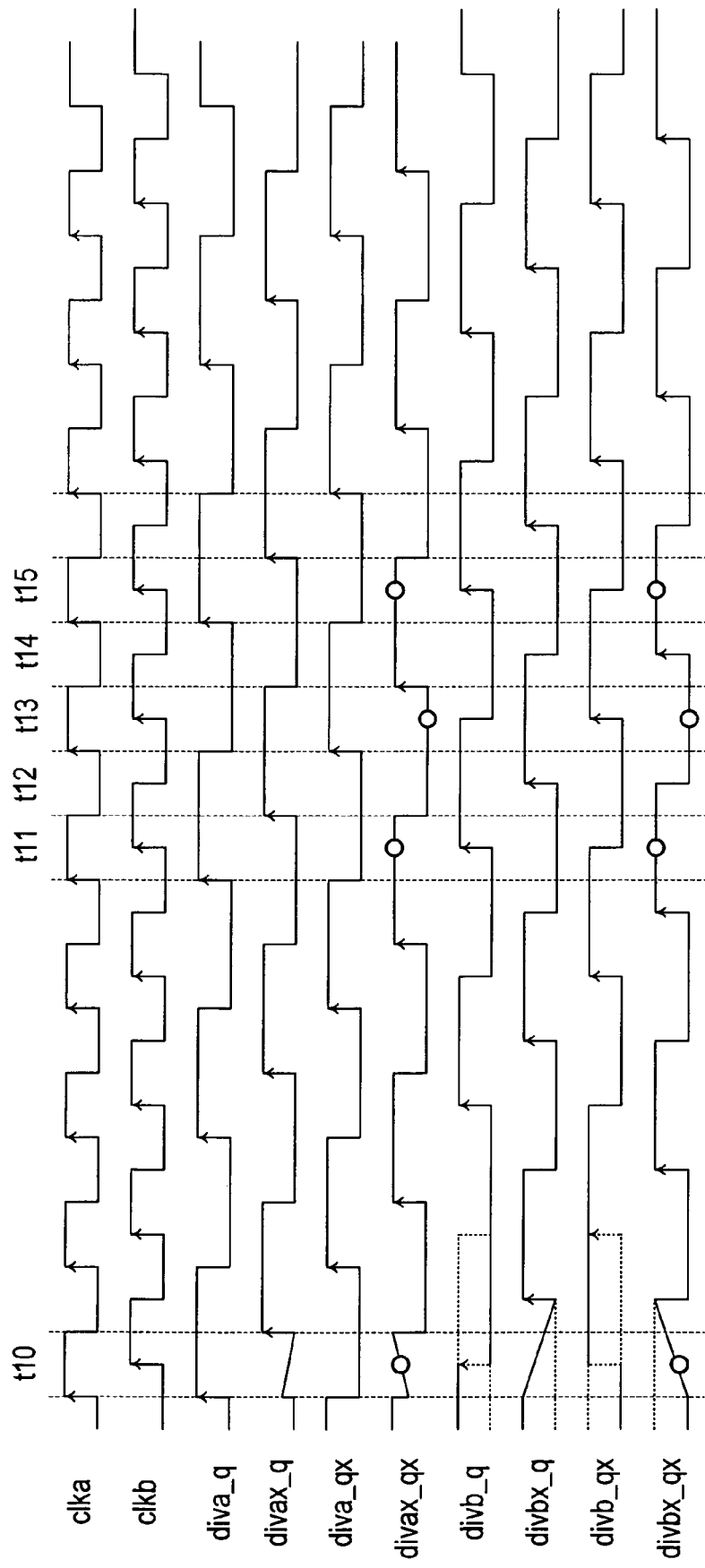

D-Latch

D-FF

D-FF

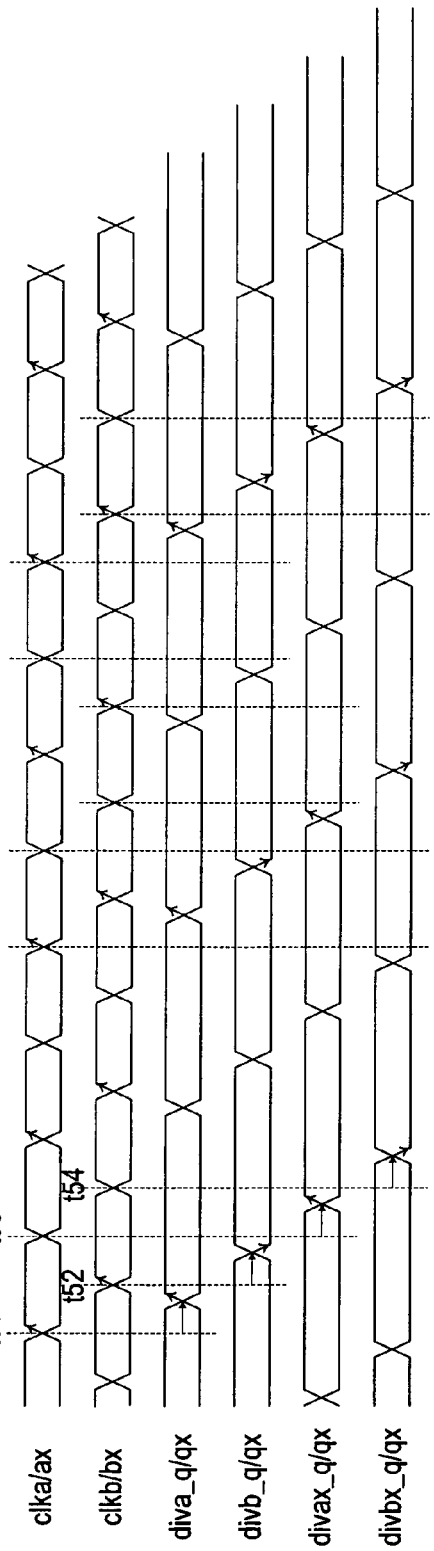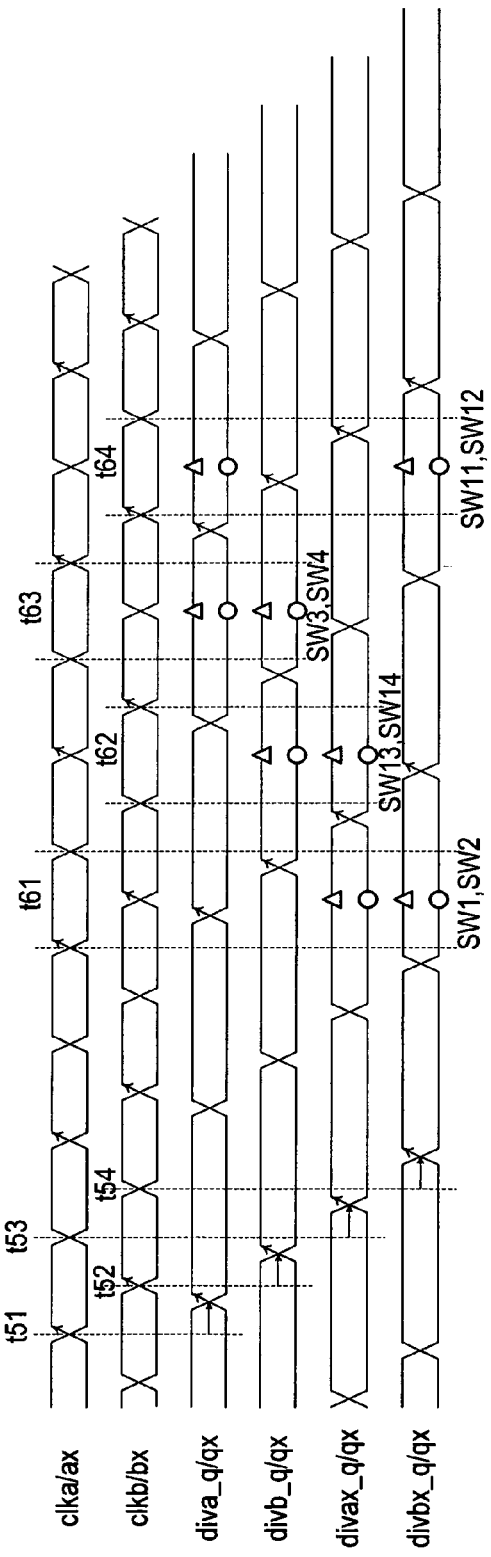
FIG. 11A With No Switches — Timing Chart of Multiphase Clock Generator Circuit (Embodiment 4)
FIG. 11B With Switches

US 7,675,340 B2

MULTIPHASE CLOCK GENERATOR CIRCUIT

CROSS-REFERENCE TO RELATED APPLICATIONS

This application is based upon and claims the benefit of priority from the prior Japanese Patent Application No. 2004-269389 filed on Sep. 16, 2004, the entire contents of which are incorporated herein by reference.

BACKGROUND OF THE INVENTION

1. Field of the Invention

The present invention relates to a multiphase clock generator circuit, and more particularly to a multiphase clock generator circuit for generating a plurality of clock pulses that differ in phase.

2. Description of the Related Art

Multiphase clock generator circuit divides a reference clock pulse to generate a plurality of clock pulses that differ in phase. The plurality of clock pulses that differ in phase is used as timing clock pulses for detecting each data in serial data in a receiver circuit for high-speed serial data. Therefore, when the serial data is transmitted at a higher speed, the phase difference of the timing clock pulses for detecting the data must also be reduced. Multiphase clock generator circuits are commonly configured with a circuit for dividing a reference clock pulse, and the reference clock cycle must be made shorter, that is to say, the frequency must be increased in order to reduce the phase difference between the divided clock pulses.

FIG. 1 is a diagram showing the configuration and operation of conventional commonly used multiphase clock generator circuit. In this multiphase clock generator circuit, four D-type flip-flops (D-FF) 11 to 14 are connected in tandem, and the inverse output div2x_qx of the last stage D-FF 14 is connected as feedback to the input data terminal D of the first stage D-FF 11. A clock pulse clk is fed to the first and third stages D-FF 11 and 13, an inverse clock of the clock pulse clk is fed to the second and fourth stages D-FF 12 and 14, and each D-FF latches input data D in response to the rising edge of the clock pulses, and outputs the data to the output data terminals Q and QX. The multiphase clock generator circuit is therefore a divider circuit for dividing the reference clock pulse clk into one fourth frequency.

In accordance with the timing waveform in the diagram, the rising output clock pulses div1_q, div1x_q, div2_q, div2x_q, div1_qx, div1x_qx, div2_qx, and div2x_qx are generated in response to the edges 1 to 8 of the reference clock pulse clk. These eight output clock pulses, which differ in phase, are generated during the interval t1 of the four cycles of the reference clock pulse clk. The frequency of the reference clock pulse clk must therefore be increased and the cycles shortened in order to simply narrow the phase difference of the output clock pulses.

When the multiphase clock generator circuit in FIG. 1 is reconfigured from a four-stage configuration to an eight-stage configuration, the output clock pulses thereof are clock pulses derived by dividing the reference clock into one eighth eight frequency, and 16 output clock pulses that differ in phase are generated in the interval of eight cycles of the reference clock pulse clk. In this case, 16 output clock pulses can be generated in the same interval t1 in FIG. 1 by doubling the frequency of the reference clock pulse clk, and the phase difference of the 16 output clock pulses is ½ the phase difference of the output clock pulses of FIG. 1. In other words, the frequency of the reference clock pulse clk must be increased in this case as well in order to narrow the phase difference of the output clock.

Thus, the multiphase clock generator circuit composed of the divider circuit in FIG. 1 must use a higher speed reference clock in order to generate a multiphase clock with a narrower phase difference. For this reason, a high-speed reference clock must be generated, and the D-FF must have a high-speed operation specification so as to enable the D-FF to operate in response to a high-speed reference clock, leading to higher costs.

A method has furthermore been proposed in prior art in which increasing the speed of the reference clock is avoided by inputting a low-speed clock pulse in which the reference clock has been divided into two cycles to a multistage-connected D-FF, and controlling the flip-flop with reference clock pulses that differ in phase. This method is shown in FIGS. 1 to 4 in Japanese Laid-Open Patent Application No. 2001-318731, for example. In this circuit, a low-speed clock pulse in which the reference clock has been divided into two clock pulses is fed to the data input of the first stage D-FF, and the multistage-connected D-FF sends an input clock pulse in response to the reference clock pulses that differ in phase. It is therefore not necessary to control the circuit operation by a high-speed clock pulse. However, since the circuit is configured to send the low-speed clock pulse to the later stage D-FFs in a sequential manner, each D-FF must be capable of high-speed operation. For this reason, high-speed operation specification is required, leading to higher costs.

In the above-described conventional example, a higher-speed reference clock must be provided in order to narrow the phase difference in a multiphase clock, and the use of a flip-flop capable of operating at higher speeds is required. For this reason, a high-speed device specification and a high-cost manufacturing process is required, leading to higher device costs.

SUMMARY OF THE INVENTION

In view of the above, an object of the present invention is to provide a multiphase clock generator circuit that can generate a multiphase clock having a narrow phase difference without the need for a high-speed reference clock and a flip-flop that operates at high speed.

In order to achieve the above-described object, the first aspect of the present invention is a multiphase clock generator circuit for generating a plurality of output clock pulses that differ in phase on the basis of a reference clock pulse, having first and second divider circuits for dividing first and second reference clock pulses that differ in phase to generate output clock pulses, and a switch for forming an intermittent short between predetermined nodes of the first and second divider circuits, wherein the switch forms a short between the predetermined nodes with timing in which the predetermined nodes are brought to the same level in a normal operating state.

In accordance with a preferred embodiment of the first aspect of the present invention, the switch is controlled to form a short between the nodes by one or both of the first and second reference clock pulses.

In accordance with a preferred embodiment of the first aspect of the present invention, the first and second divider circuits respectively have a plurality of latch circuits connected in the form of a ring, and are configured so that the latch circuits take input signals and provide output to the latch circuits of the later stages in response to the corresponding reference clocks, and the outputs of the plurality of latch circuits are outputted as the output clock pulses. The latch circuits may be flip-flop circuits.

In accordance with a preferred embodiment of the first aspect of the present invention, the first and second divider circuits respectively have a plurality of latch circuits connected in the form of a ring, and are configured so that the latch circuits of the odd-numbered stages take input signals and provide output to the latch circuits of the later stages in response to the corresponding reference clocks, the latch circuits of the even-numbered stages take input signals and provide output to the latch circuits of the later stages in response to an inverse reference clock pulse of the corresponding reference clocks, and the outputs of the plurality of latch circuits are outputted as the output clock pulses. The latch circuits may be flip-flop circuits.

In accordance with a preferred embodiment of the first aspect of the present invention, the switch has a first switch for forming a short between the first nodes of the first and second divider circuits in response to a first reference clock, and a second switch for forming a short between the second nodes of the first and second divider circuits in response to a second reference clock.

In accordance with a preferred embodiment of the first aspect of the present invention, the first and second divider circuits respectively have a plurality of latch circuits connected in the form of a ring, and are configured so that the latch circuits take input signals and provide output to the latch circuits of the later stages in response to the corresponding reference clocks, and the outputs of the plurality of latch circuits are outputted as the output clock pulses; and the switch has a first switch for forming a short between first latch circuit output nodes of the first and second divider circuits in response to a first reference clock, and a second switch for forming a short between second latch circuit output nodes of the first and second divider circuits in response to a second reference clock. The latch circuits may be flip-flop circuits.

In order to achieve the above-described object, the second aspect of the present invention is a multiphase clock generator circuit for generating a plurality of output clock pulses that differ in phase on the basis of a reference clock pulse, wherein the generator circuit has a plurality of divider circuits for dividing a plurality of reference clock pulses that differ in phase to generate output clock pulses, and a switch for forming an intermittent short between predetermined nodes of a first and second divider circuits selected from the plurality of divider circuits, and wherein the switch forms a short between the predetermined nodes with timing in which the predetermined nodes are brought to the same level in a normal operating state.

In accordance with a preferred embodiment of the second aspect of the present invention, the switch forms a short between the predetermined nodes in response to a reference clock pulse correlated with the first or second divider circuit.

In accordance with a preferred embodiment of the second aspect of the present invention, the switch has a first switch for forming a short between the first nodes of the first and second divider circuits in response to a first reference clock correlated with the first divider circuit, and a second switch for forming a short between the second nodes of the first and second divider circuits in response to a second reference clock correlated with the second divider circuit.

In accordance with a preferred embodiment of the above-described invention, since the reference clock pulses mutually differ in phase and a plurality of divider circuits carry out dividing operation to generate a plurality of output clock pulses whose phases are different each other, a plurality of output clock pulses with a narrow phase difference can be generated without increasing the speed of the reference clock pulse. Also, since the divider circuits are divided into plural, the division ratio is smaller, and therefore high-speed dividing operation is not required. A plurality of output clock pulses with a narrowed phase difference can therefore be generated with a low-speed operation, and lower costs can be ensured.

BRIEF DESCRIPTION OF THE DRAWINGS

FIG. 2 shows a diagram of the basic principles and a diagram of the detailed circuitry of the multiphase clock generator circuit in the present embodiment;

FIG. 3 is a timing chart of multiphase clock generator circuit in FIG. 2;

FIGS. 11A and 11B show timing charts of the operation of the multiphase clock generator circuit in the fourth embodiment.

DESCRIPTION OF THE PREFERRED EMBODIMENTS

Figure 1:
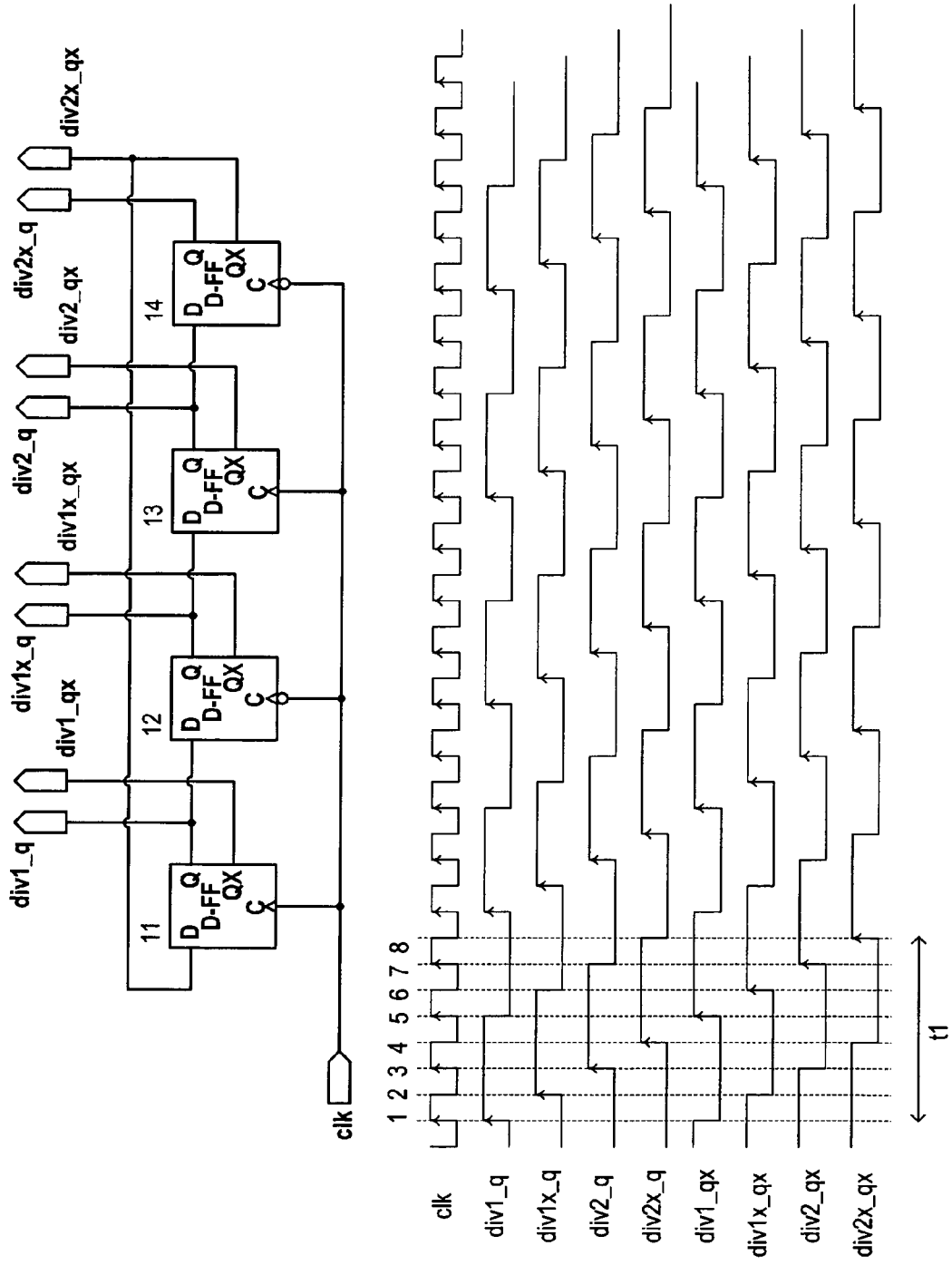
FIG. 1 is a diagram showing the configuration and operation of a conventional common multiphase clock generator circuit.

Embodiments of the present invention are described below with reference to the diagrams. However, the technical scope of the present invention is not limited to these embodiments, but extends to the content of the claims and their equivalents.

FIG. 2 shows a diagram of the basic principles and a diagram of the detailed circuitry of the multiphase clock generator circuit in the present embodiment. The multiphase clock generator circuit of the diagram of the basic principles in FIG. 2A has two dividers diva and divb for dividing the reference clock pulses clka and clkb that differ in phase, and a switch SWab for shorting the output nodes divax_qx and divbx_qx of the dividers in response to the H-level signal of the reference clock pulse clka. The divider circuit diva connects the D-type flip-flops 11a and 11ax in the form of a ring, and the flip-flops 11a and 11ax latch signals of the input data terminals D when the reference clock pulse clka and the inverse clock thereof are at an H level and output the non-inverse signals and inverse signals of the input data D to the output data terminals Q and QX. The inverse output data terminal QX of the later stage flip-flop 11ax is connected to the input data terminal D of the first stage flip-flop 11a. The divider circuit diva outputs four output clock pulses diva_q, diva_qx, divax_q, and divax_qx that differ in phase from the two flip-flops output data terminal Q and inverse output data terminal QX. The divider circuit divb is also essentially the same as the divider circuit diva in that the reference clock pulse clkb causes the flip-flops 11b and 11bx to latch the signals of the data input terminal D and output the signals to the output data terminals Q and QX.

In other words, the multiphase clock generator circuit has a divider circuit diva for dividing the reference clock pulse clka into ½ frequency and generating the output clock pulses diva_q, diva_qx, divax_q, and divax_qx that differ in phase, and a divider circuit divb for dividing the reference clock pulse clkb that is offset in phase from the reference clock pulse clka, into ½ frequency, and generating the output clock pulses divb_q, divb_qx, divbx_q, and divbx_qx that differ in phase. The multiphase clock generator circuit also has a switch SWab for shorting the nodes divax_qx and divbx_qx of both divider circuits in response to the H-level of the reference clock pulse clka.

The specific circuit of FIG. 2B shows a switch SWab that has a CMOS transfer gate, and the CMOS transfer gate is conductively controlled by the reference clock pulse clka and the inverse of the reference clock pulse clkax. The remainder of the configuration is the same as the circuit in FIG. 2A.

FIG. 3 is a timing flowchart of the multiphase clock generator circuit in FIG. 2. In FIG. 3, the interval t10 is the initial operating state, and the intervals t11 to tl3 are normal operating states. First, operation in the normal operating states is described.

The reference clock pulses clka and clkb are clock pulses with the same frequency but differing in phase by 90°, as shown in the diagram. These reference clock pulses are generated from a single reference clock by a reference clock generator circuit (not shown). The circuit in which the single reference clock generates clock pulses that differ in phase by 90° in this manner is commonly known to those skilled in the art, and a description thereof is omitted.

The divider circuit diva divides the reference clock pulse clka into ½ frequency and generates the output clock pulses diva_q, diva_qx, divax_q, and divax_qx that differ in phase. In the interval t11, the output clock diva_q assumes an H level and the inverse output clock diva_qx assumes an L level, in response to the H-level signal of the reference clock pulse clka, as shown in the diagram. In the interval tl2, the output clock divax_q assumes an H level, and the inverse of the output signal divax_qx assumes the L level, in response to the L-level signal of the reference clock pulse clka. The inverse of the operation described above is then carried out in the intervals t13 and t14. As a result, the output clock pulses diva_q, diva_qx, divax_q, and divax_qx are double-cycle clock pulses in which the reference clock pulse clka has been divided into ½ frequency, and that have phases that differ by 180° of the reference clock pulse clka.

The divider circuit divb operates in the same manner as the divider circuit diva. The reference clock pulse clkb is divided into ½ frequency, and the output clock pulses divb_q, divb_qx, divbx_q, and divbx_qx the phases of which are offset by 180° of the reference clock pulse clkb are generated with cycles that are double those of the reference clock pulse. These output clock pulses are mutually offset by a phase of 90° of the reference clock pulse from the output clock pulses of the divider circuit diva. Eight output clock pulses offset by a phase of 90° of the reference clock pulse are therefore generated.

The two divider circuits diva and divb divide the mutually differing reference clock pulses clka and clkb, and the operations thereof are independent. Therefore, if the operations of both divider circuits are not matched, the output clock pulses thereof cannot be made to match due to a difference in the initial states (initial states of the latch circuits, in particular) of the flip-flops of the divider circuits. As a result, the eight output clock pulses do not achieve a phase offset in the desired order. In view of the above, a switch SWab is provided to ensure that the operations of the divider circuits match. In other words, the switch SWab is conductive in the intervals t11, t13, and t15 of the H-level signal of the reference clock pulse clka, and the nodes divax_qx and divbx_qx are shorted. The operation of both divider circuits diva and divb can be matched by the shorting action of the shorting switch SWab. In other words, since the two nodes divax_qx and divbx_qx are shorted by the switch in the intervals t11, t13, and t15, both of the divider circuits operate so that the levels of the output nodes match. As shown in the diagram with circles, the nodes divax_qx and divbx_qx thereof are set at levels that match the H level, L level, and H level in the intervals t11, t13, and t15, respectively. The switch SWab is in a non-conduct state in the intervals other than those noted above, and the operating independence of both the divider circuits is maintained.

The nodes divax_qx and divbx_qx shorted by the switch SWab are controlled so as to be at the same level in the initial operating state of the multiphase clock generator circuit by providing such a shorting switch SWab. The interval t10 is the initial operating state, and it is assumed that the output node divax_qx is at an H level and the output node divbx_qx is at an L level in response to the rising edge of the reference clock pulse clka. Thus, even if the output nodes divax_qx and divbx_qx are at different levels due to the fact that the initial states of the divider circuits are different, both output nodes are shorted by the switch SWab, so that the output node divbx_qx on the divider circuit divb side is forcibly driven from an L-level to an H-level, as shown by the circles in the diagram, in the interval t10 in which the reference clock pulse clka is at an H level. In other words, it is apparent that this operation is due to the fact that the H-side drive capability of the inverse output QX of the flip-flop 11ax is stronger than the L-side drive capability of the inverse output QX of the flip-flop 11bx, resulting in convergence to either level.

The flip-flop 11b in the divider circuit divb latches the level of the shorted output node divbx_qx in response to the rising edge of the reference clock pulse clkb, and provides output to the output nodes divb_q and divb_qx. In FIG. 3, because of the possibility that the shorted output node divbx_qx is not at a sufficiently H level, the levels of the output nodes divb_q and divb_qx are set to L and H, or to H and L (broken lines). The flip-flop circuit 11bx latches the level of the output node divb_q in response to the rising edge of the subsequent reference clock pulse clkb, and provides output to the output nodes divbx_q and divbx_qx. Also, the shorting switch is conductive in response to the rising edge of the subsequent reference clock pulse clka, and the output nodes divax_qx and divbx_qx are shorted again. The output node divbx_qx comes near the level of the output node divax_qx at this time as well. When the level of the shorted output node divbx_qx rises above the input gate threshold of the flip-flop 11b, the same level as the output node divax_qx of the divider circuit diva can be received. As a result, the operation of the divider circuit divb is brought into conformity with the operation that is delayed by a 90° phase from the operation of the divider circuit diva. In this initial operating state, the dividing operation of the divider circuit diva and the dividing operation of the divider circuit divb are stabilized with the operation that is offset by a phase difference of 90° from the reference clock pulses clka and clkb by passing through a plurality of intervals t10.

In a normal operating state of intervals t11 to t15, the two divider circuits operate to divide the reference clock pulse of each into ½ frequency, and the dividing operations thereof match in a relationship in which the phases are offset by 90°. As a result, eight output clock pulses are generated with a phase difference of 90° in the following sequence: diva_q, divb_q, divax_q, divbx_q, diva_qx, divb_qx, divax_qx, and divbx_qx. In the present embodiment, eight output clock pulses offset in phase are generated within two cycles of the intervals t11 to t14 of the reference clock pulses clka and clkb, in contrast to the conventional example in which eight output clock pulses offset in phase are generated within four cycles of the intervals t1 of the reference clock pulse clk, as can be seen from a comparison with the timing chart of the conventional example in FIG. 1. In other words, the same eight output clock pulses can be generated with a lower-speed reference clock. The conventional example and the present embodiment both have four flip-flops.

The multiphase clock generator circuit of the present embodiment is not limited to two divider circuits, and a configuration with four or eight divider circuits is also possible. The divider circuits are not limited to divider circuits composed of two flip-flops, and divider circuits composed of four or eight flip-flops are also possible. In any of these configurations, a low-speed reference clock can be used and the flip-flops are not required to operate at high speed in comparison with divider circuits in which the same number of flip-flops is connected in the form of a ring.

Figure 4:
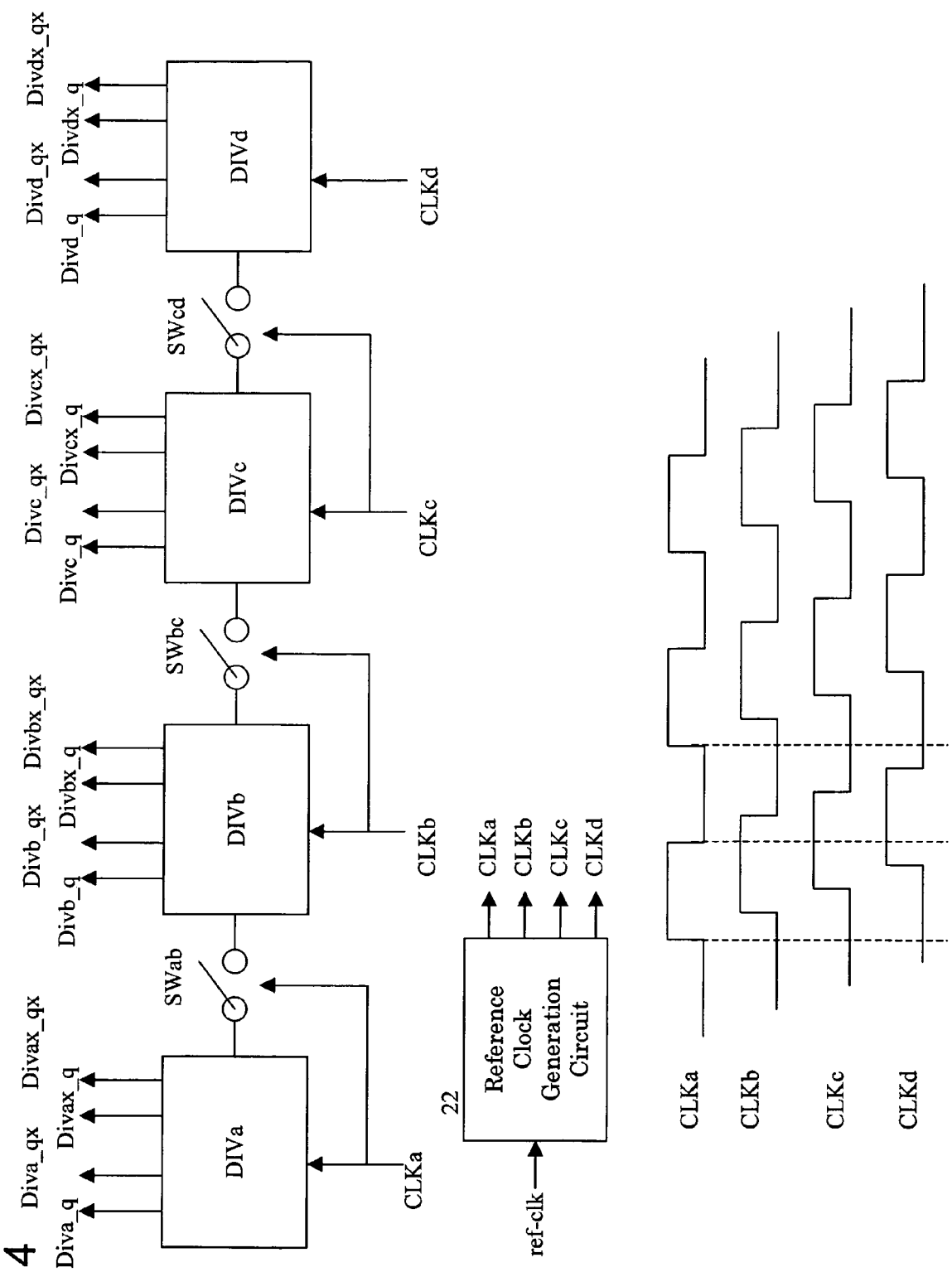
FIG. 4 is a schematic structural diagram of the multiphase clock generator circuit in the present embodiment.

FIG. 4 is a schematic structural diagram of the multiphase clock generator circuit in the present embodiment. A reference clock generator circuit 22 generates four reference clock pulses clka to clkd with phases offset by 45° from a single reference clock ref-clk, as shown in the diagram, and the reference clock pulses thereof are divided in the corresponding four divider circuits DIVa to DIVd. The configuration of the divider circuits is the same as in FIG. 2. The output nodes of the first stage divider circuit DIVa and the second stage divider circuit DIVb are intermittently shorted by a switch SWab. The switch SWab is controlled by the reference clock pulse clka, for example, but may be controlled by the reference clock pulse clkb. Also, a plurality of switches SWab may be provided, each being controlled by both reference clock pulses.

In a similar manner, a switch SWbc is disposed between the divider circuit DIVb and divider circuit DIVc, a switch SWcd is disposed between the divider circuit DIVc and divider circuit DIVd, and these switches are controlled by the reference clock pulses clkb and clkc. Since these switches are capable of matching the levels between the nodes that need to be brought into conformity in a normal operating state, the reference clock pulse clkc or clkd may provide control in accordance with timing that brings the nodes to be shorted to the same desired level.

Thus, the reference clock pulses that correspond to the four divider circuits are divided, and divided output clock pulses are generated. Since predetermined nodes of the divider circuits are intermittently shorted by a switch, the dividing operations of the four divider circuits match in a state in which the four reference clock pulses clka to clkd are offset in phase by 45°. As a result, 16 output clock pulses, each offset in phase by 45°, are generated.

Figure 5C:
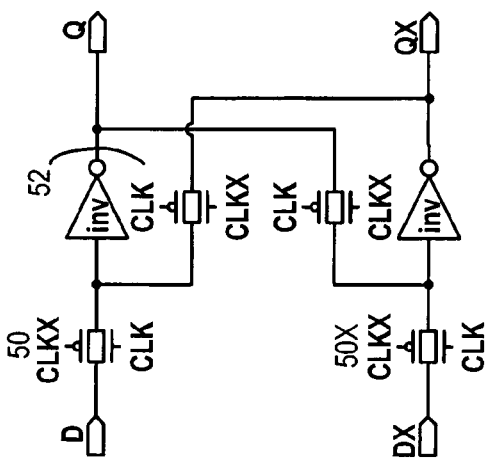
FIGS. 5A-5C show detailed circuit diagrams of the flip-flops of the divider circuits in the present embodiment.
Figure 5A:
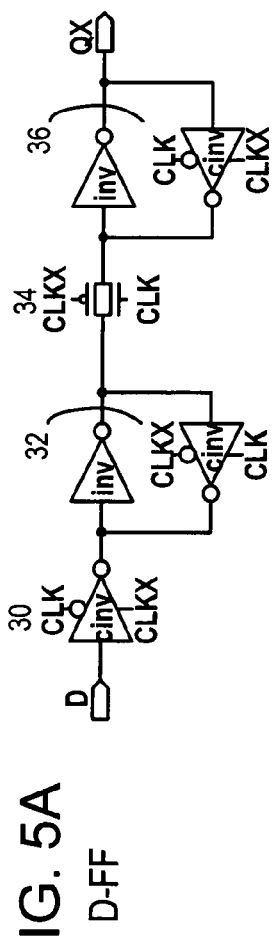
Figure 5B:
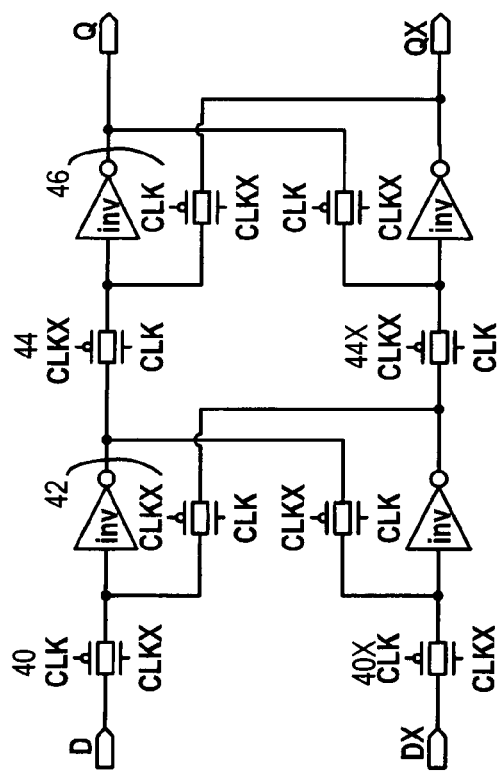

FIGS. 5A and 5B show detailed circuit diagrams of the flip-flops of the divider circuits in the present embodiment. The flip-flops constituting the divider circuits diva and divb are D-type flip-flop circuits shown in FIGS. 5A and 5B, for example. In the circuit shown in FIG. 5A, the configuration has an input gate 30 for forming a conductive state with the fall of the clock pulse CLK, a early stage latch circuit 32 for latching the input data D with the rise of the clock pulse CLK, a transfer gate 34 for forming a conductive state with the rise of the clock pulse CLK, and a later stage latch circuit 36 for latching with the fall of the clock pulse CLK. In other words, when the clock pulse CLK is at an L level, the input data D is brought to a latch-enabled state by the early stage latch circuit 32, the early stage latch circuit 32 latches the input data D in response to the rise of the clock pulse CLK, and the latched signal is outputted from the output data terminal QX via the transfer gate 34 and the inverters of later stage latch circuit 36. The output data QX is latched by the later stage latch circuit 36 in response to the fall of the clock pulse CLK, and the state of the output data thereof is maintained while the clock pulse CLK is at an L level. In short, when the clock pulse CLK is at an H level, the input data D is received and is outputted to the output data terminal QX, and when the clock pulse CLK is at an L level, the state of the output data thereof is maintained. Since the effect of the input data D is blocked when the clock pulse CLK is at an H level, a stable latching operation can be achieved and output data can be maintained.

FIG. 5B also shows a D-type flip-flop circuit that operates in the same manner as FIG. 5A. In a similar fashion, the configuration has input gates 40 and 40X, an early stage latch circuit 42, transfer gates 44 and 44X, and a later stage latch circuit 46. However, this configuration has complementary input data D and DX and complementary output data Q and QX with mutually opposite phases, which is different from FIG. 5A.

FIG. 5C is a D-type latch circuit. This latch circuit has an input gate 50, 50X for forming a conductive state when the clock pulse CLK is at an H level, and a latch circuit 52 for performing latch operations while the clock pulse CLK is at an L level. This circuit receives input data D and DX in response to the rise of the clock pulse CLK, and outputs the result to the output data terminals Q and QX. During the state in which the clock pulse CLK is at L level, this state is latched by the latch circuit 52. Therefore, the latch circuit 52 has the same function as the later stage latch circuit of the above-described flip-flop.

The divider circuits of the multiphase clock generator circuit in the present embodiment shown in FIG. 2 can be configured by connecting the flip-flop circuits shown in FIG. 5A or 5B in the form of a ring, or may be configured by connecting the D-type latch circuits shown in FIG. 5C in the form of a ring. Either configuration can have a latch function for receiving in response to the rise of the clock and latching the output state thereof while the clock is at an L level.

Figure 6:
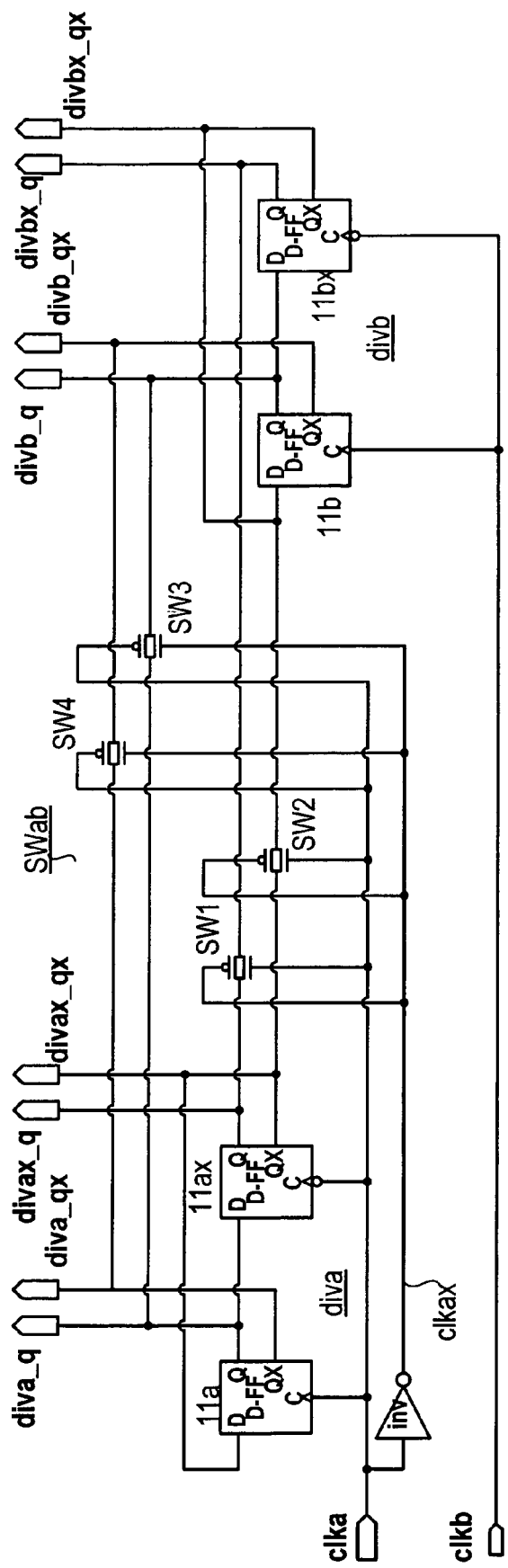
FIG. 6 is a circuit diagram of the multiphase clock generator circuit in the second embodiment.

FIG. 6 is a circuit diagram of the multiphase clock generator circuit in the second embodiment. In the multiphase clock generator circuit in FIG. 6, the configuration is adopted for shorting all of the four output clock nodes from the divider circuit diva and the four output clock nodes from the divider circuit divb via the switches SW1 to SW4, and the switches are configured to be controlled with the reference clock pulse clka and the inverse reference clock pulse clkax thereof. In other words, in the example in FIG. 2, a pair of output nodes divax_qx and divbx_qx is controllably shorted by the switch SWab. The load capacity of the switch is thereby added to the pair of controllably shorted output nodes, and the output capacity becomes greater than the other nodes, resulting in poor balance. In contrast, since a shorting switch is provided to all of the output nodes in the circuit of the second embodiment, the capacity of all the output nodes can be made equal and the circuit balance is improved, contributing to high-speed operation.

Figure 7:
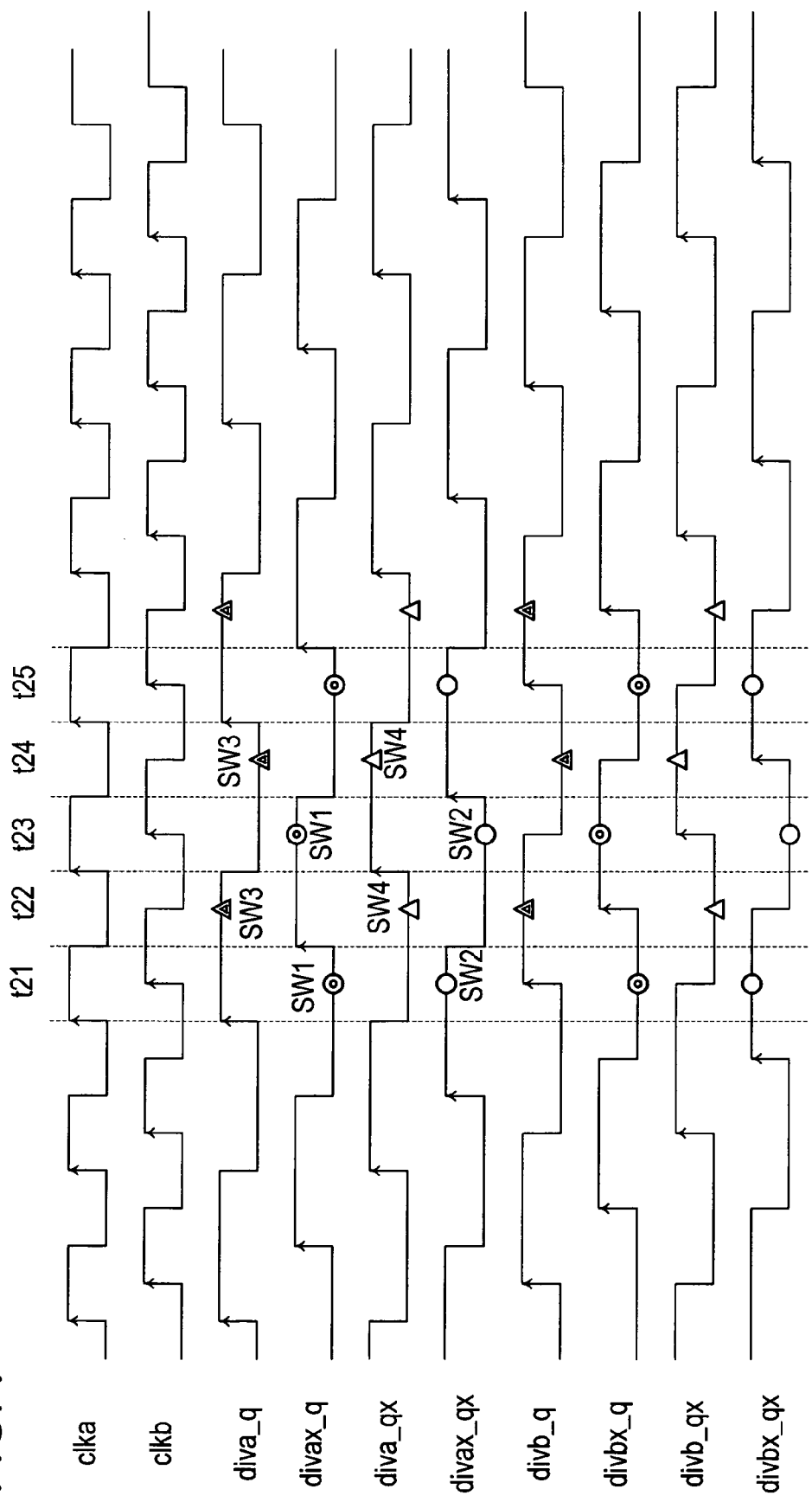
FIG. 7 is a timing chart of the operation of the multiphase clock generator circuit in the second embodiment.

FIG. 7 is a timing chart of the operation of the multiphase clock generator circuit in the second embodiment. This operation timing is essentially the same as in FIG. 3. Shown in FIG. 7, however, is the relationship between a combination of output nodes provided with shorting switches, and reference clock pulses for controlling the shorting timing thereof on the basis of the relationship between the levels of the output nodes in a normal operating state.

In accordance with the operation timing chart of FIG. 7, since it is expected that the nodes divax_q and divbx_q, and the nodes divax_qx and divbx_qx are brought to the same level in the intervals t21 and t23 in which the reference clock pulse clka is at an H level, the combination of these output nodes is controllably shorted by the switches SW1 and SW2. Also, since it is expected that the nodes diva_q and divb_q, and the nodes diva_qx and divb_qx are brought to the same level in the intervals t22 and t24 in which the reference clock pulse clka is at an L level, the combination of these output nodes is controllably shorted by the switches SW3 and SW4. The switches SW1 and SW2 are therefore in a conductive state when the reference clock pulse clka is at an H level, and the switches SW3 and SW4 are in a conductive state when the reference clock pulse clka is at an L level.

In the multiphase clock generator circuit of FIG. 7, from among all the outputs Q and QX of the flip-flops 11a, 11ax, 11b, and 11bx constituting the divider circuits, all of the output pairs that are expected to be at the same level with the same timing are shorted by switches. The same load capacity is therefore formed in all the outputs Q and QX, the capacity balance is improved, the circuit operating errors are reduced, and high-speed operation is made possible. In the second embodiment as well, the D-type flip-flop circuit shown in FIG. 5 may be adopted as the flip-flop circuit, and the D-type latch circuit shown in FIG. 5 may also be adopted.

Figure 8:
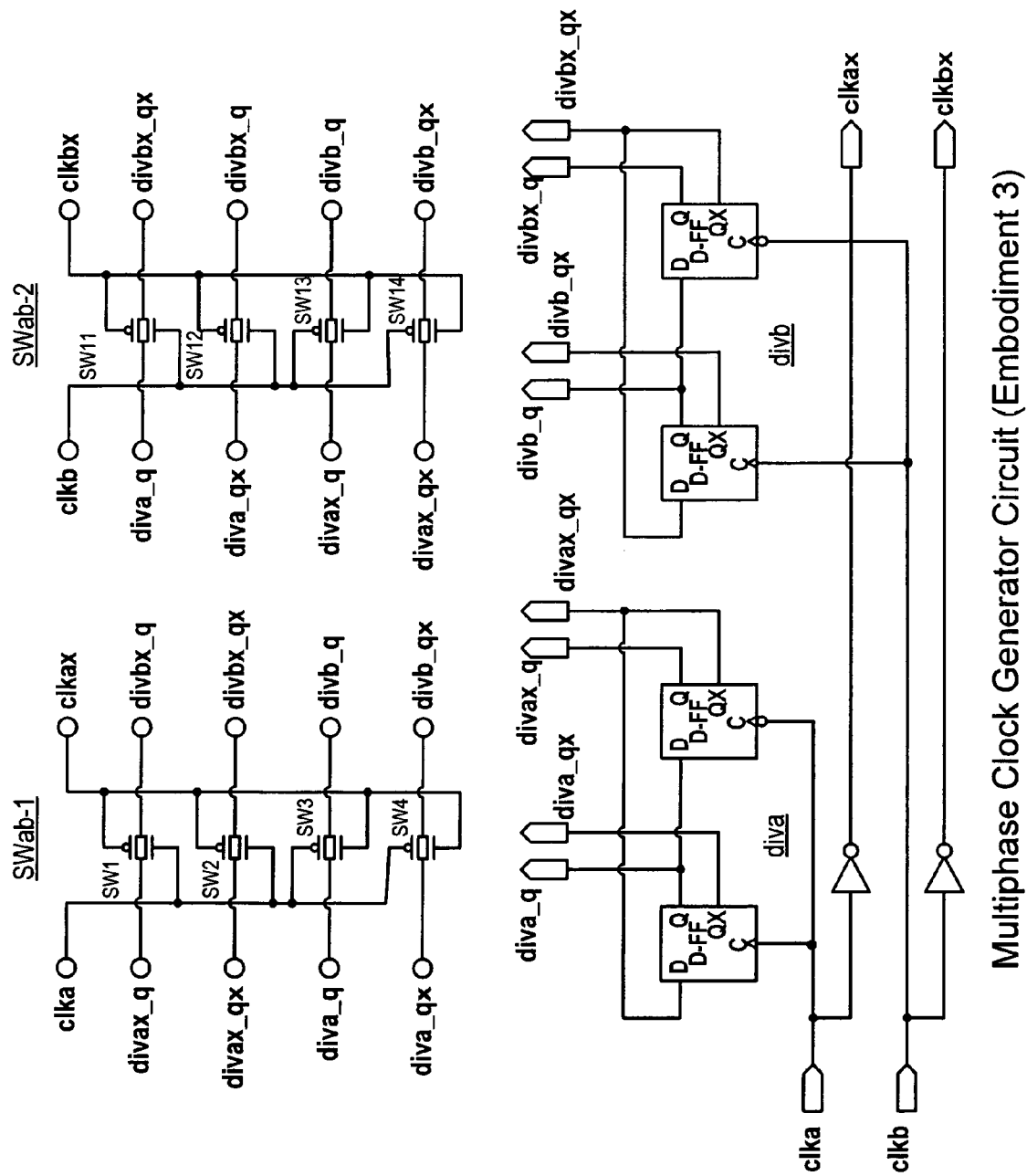
FIG. 8 is a circuit diagram of the multiphase clock generator circuit in the third embodiment.
Figure 9:
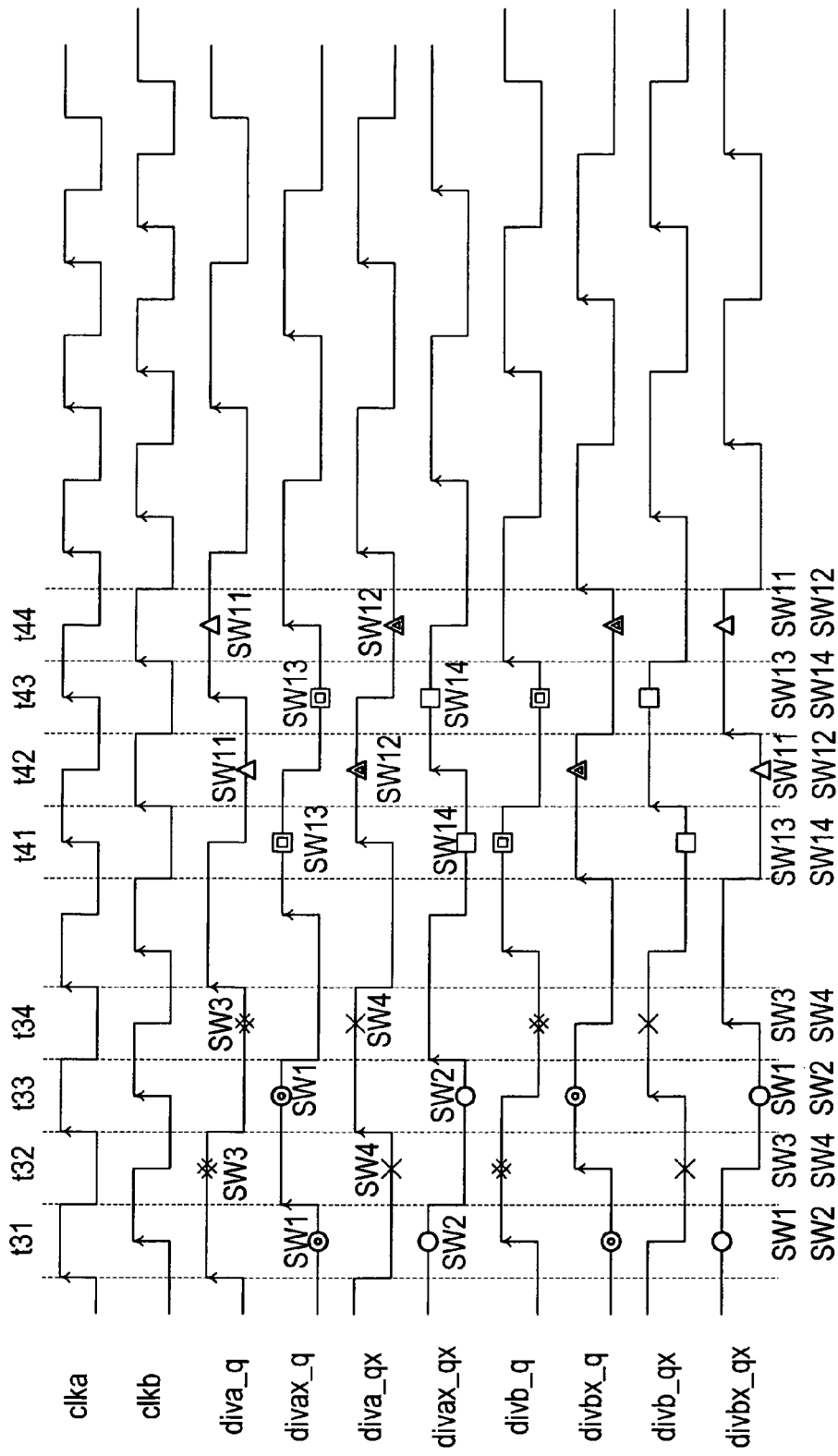
FIG. 9 is a timing chart of the operation of the multiphase clock generator circuit in the third embodiment.

FIG. 8 is a circuit diagram of the multiphase clock generator circuit in the third embodiment. Also, FIG. 9 is a timing chart of the operation of the multiphase clock generator circuit in the third embodiment. In this multiphase clock generator circuit, in addition to a switch group SWab-1 that is controlled by the reference clock pulse clka, a switch group SWab-2 controlled by the reference clock pulse clkb is provided. The load capacities for the two reference clock pulses clka and clkb can thereby be made equal, and the balance of the two reference clock pulses can be improved. In comparison with the second embodiment, the size of the switch transistors can be halved by doubling the switch groups, and the output load capacity of the flip-flops do not increase and can be made the same as in the second embodiment.

The switch groups SWab-1 and SWab-2 are described below with reference to the operation timing charts of FIG. 9. First, the four switches SW1 to SW4 of the switch group SWab-1 controlled by the reference clock pulse clka are the same as in the second embodiment. In other words, the switches SW1 and SW2 form a short between the output nodes that are expected to be at the same level with the same timing in the intervals t31 and t33 in which the reference clock pulse clka is at an H level, as shown in FIG. 9, and the switches SW3 and SW4 form a short between the output nodes that are expected to be at the same level with the same timing in the intervals t32 and t34 in which the reference clock pulse clka is at an L level.

In a similar fashion, the switches SW11 and SW12 form a short between the nodes diva_q and divbx_qx and the nodes diva_qx and divbx_q in the intervals t42 and t44 in which the reference clock pulse clkb is at an H level. Also, the switches SW13 and SW14 form a short between the nodes divax_q and divb_q and the nodes divax_qx and divb_qx in the intervals t43 and t41 in which the reference clock pulse clkb is at an L level.

In other words, the switch group SWab-1 forms a short between the outputs of the early stage flip-flops of the divider circuits diva and divb and between the outputs of the later stage flip-flops, in response to the reference clock pulse clka. Also, in response to the reference clock pulse clkb, the switch group SWab-2 forms a short between the outputs of the early stage flip-flops of the divider circuit diva and the outputs of the later stage flip-flops of the divider circuit divb, and forms a short between the outputs of the later stage flip-flops of the divider circuit diva and the outputs of the early stage flip-flops of the divider circuit divb.

The flip-flop circuits constituting the divider circuits in the third embodiment as well can be composed of the flip-flop circuits or latch circuits of FIG. 5.

Figure 10:
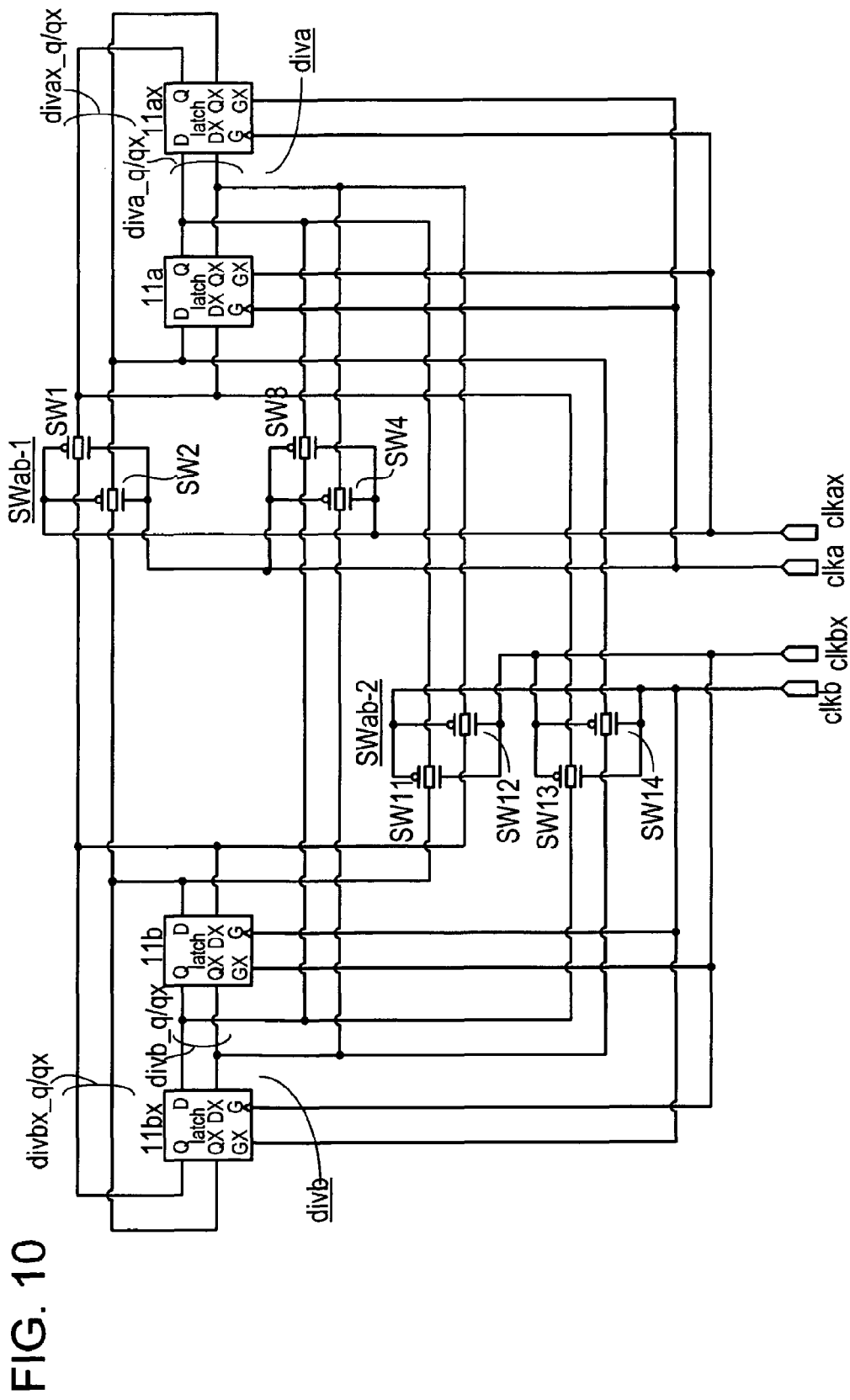
FIG. 10 is a circuit diagram of the multiphase clock generator circuit in the fourth embodiment.

FIG. 10 is a circuit diagram of the multiphase clock generator circuit in the fourth embodiment. The circuit has the same switch groups SWab-1 and SWab-2 as the third embodiment, and uses D-type latch circuits instead of the flip-flop circuits constituting the divider circuits diva and divb. In other words, the circuits are the latch circuits shown in FIG. 5C. The operation of the multiphase clock generator circuit is therefor the same as in the third embodiment.

In FIG. 10, the divider circuit diva for dividing the reference clock pulse clka is shown on the left side and the divider circuit divb for dividing the reference clock pulse clkb is shown on the right side. Also, the divider circuit divb is configured with the first stage latch circuit 11b and the second stage latch circuit 11bx inversely disposed left and right; hence, the signal flow thereof is clockwise different from the divider circuit diva. Also, the switch groups SWab-1 and SWab-2 are disposed in the same manner as FIG. 8. Since the divider circuits are configured by connecting the D-type latch circuits in the form of a ring, the configuration of the latch circuits is simplified in comparison with the case in which flip-flop circuits are used, and high-speed operation is made possible. However, latch circuits are inferior to flip-flop circuits from the aspect of stable operation.

FIGS. 11A and 11B show timing charts of the operation of the multiphase clock generator circuit in the fourth embodiment. Shown in FIG. 11A is the timing chart of the operation in the case in which a set of switches is not provided, and shown in FIG. 11B is the timing chart of the operation in the case in which a set of switches is provided.

In FIG. 11A, the output clock diva_q/qx changes in response to the reference clock pulse clka/ax at time t51, the output clock divb_q/qx changes in response to the reference clock pulse clkb/bx at the time t52, and the output clock pulses divax_q/qx and divbx_q/qx similarly change at times t53 and t54. Since a switch groups for causing the operations of both divider circuits to match is not provided, the level of the output clock pulses is uneven, and the output of the two divider circuits are opposite phases. For this reason, the four output clock pulses obtained by dividing the reference clock pulse clka and the four output clock pulses obtained by dividing the reference clock pulse clkb are not generated with a phase difference of 90° in the following sequence: diva_q, divb_q, divax_q, divbx_q, diva_qx, divb_qx, divax_qx, and divbx_qx. See arrows of the output clock pulses in FIG. 11A.

In FIG. 1B, the corresponding output clock pulses diva_q/qx, divb_q/qx, divax_q/qx, and divbx_q/qx all change in the same direction at the times t51 to t54. This is due to the fact that the shorting switch group SWab is provided, the output nodes that are expected to be at the same level with the same timing are shorted with each other at the time of first operation, and the operation of both divider circuits are matched. For this reason, the triangles and circles shown in the diagram are at the same level in the time intervals t61, t62, t63, and t64, and the eight output clock pulses are generated with a phase difference of 90° in the following sequence: diva_q, divb_q, divax_q, divbx_q, diva_qx, divb_qx, divax_qx, and divbx_qx. See arrows of the output cock pulses in FIG. 11B.

In accordance with the present embodiment as described above, reference clock pulses having a phase difference cause the plurality of divider circuits to operate, switch groups are provided for intermittently shorting between the nodes expected to be at the same level with the same timing in the plurality of divider circuits, and the operations of the plurality of divider circuits are matched. The dividing ratio of the divided circuits can be reduced and a plurality of output clock pulses with a narrow phase difference can be generated even if the frequency of the reference clock pulse is low. Also, the latch circuits or the flip-flop circuits constituting the divider circuits are not required to operate at high speed. The output load balance of the divider circuits is improved and high-speed operation is made possible by providing a switch group to all the output nodes. Hence, in accordance with the multiphase clock generator circuit of the present embodiment, the occurrence of operational errors is reduced because the circuit balance is increased even with considerable fluctuations, due to the low-speed operation of the latch circuits and flip-flop circuits that constitute the divider circuits.

What is claimed is:

1. A multiphase clock generator circuit for generating a plurality of output clock pulses that differ in phase on the basis of a reference clock pulse, having
   a first divider circuit, having a plurality of latch circuits connected in the form of a ring, for dividing a first reference clock pulse to generate a plurality of first output clock pulses that differ in phase;
   a second divider circuit having a plurality of latch circuits connected in the form of a ring, for dividing a second reference clock pulse to generate a plurality of second output clock pulses that differ in phase, wherein said first and second reference clock pulses have different phases from each other; and
   a switch for forming an intermittent short between predetermined nodes of the first and second divider circuits, wherein
   the switch forms a short between the predetermined nodes with timing in which the predetermined nodes are brought to the same level in a normal operating state,
   wherein the switch has a first switch for forming a short between the first nodes of the first and second divider circuits in response to the first reference clock pulse, and a second switch for forming a short between the second nodes of the first and second divider circuits in response to the second reference clock pulse.

2. A multiphase clock generator circuit for generating a plurality of output clock pulses that differ in phase on the basis of a reference clock pulse, comprising:
   a plurality of divider circuits for dividing a plurality of reference clock pulses respectively, wherein said plurality of reference clock pulses have different phases from each other and each divider circuit generates a plurality of output clock pulses that differ in phase at respective output nodes; and
   a switch for forming an intermittent short between predetermined output nodes of a first and second divider circuits selected from the plurality of divider circuits, and wherein
   the switch forms a short between the predetermined output nodes with timing in which the predetermined output nodes are brought to the same level in a normal operating state,
   wherein the divider circuits have the plurality of latch circuits connected in the form of a ring via a pair of different signals, and are configured so that the latch circuits take a pair of input signals and provide output to the latch circuit of the later stage in response to the corresponding reference clock pulses, and the pair of outputs of the plurality of latch circuits are outputted as the output clock pulses, and
   the switch has a first switch for forming a short between a first combination of the pair of output nodes of the first divider circuit and the pair of output nodes of the second divider circuit, and a second switch for forming a short between a second combination of the pair of output nodes of the first divider circuit and the pair of output nodes of the second divider circuit.

3. A multiphase clock generator circuit for generating a plurality of output clock pulses that differ in phase on the basis of a reference clock pulse, comprising:
   a plurality of divider circuits, respectively having a plurality of latch circuits connected in the form of a ring, for dividing a plurality of reference clock pulses respectively, wherein said plurality of reference clock pulses have different phases from each other and each divider circuit generates a plurality of output clock pulses that differ in phase; and
   a switch for forming an intermittent short between predetermined nodes of a first and second divider circuits selected from the plurality of divider circuits, and wherein
   the switch forms a short between the predetermined nodes with timing in which the predetermined nodes are brought to the same level in a normal operating state,
   wherein the switch has a first switch for forming a short between the first nodes of the first and second divider circuits in response to the first reference clock pulse correlated with the first divider circuit, and a second switch for forming a short between the second nodes of the first and second divider circuits in response to the second reference clock pulse correlated with the second divider circuit.

* * * * *